United States Patent
Jo et al.

(10) Patent No.: US 8,479,085 B2
(45) Date of Patent: Jul. 2, 2013

(54) MEMORY SYSTEM WITH ERROR CORRECTION DECODER ARCHITECTURE HAVING REDUCED LATENCY AND INCREASED THROUGHPUT

(75) Inventors: Nam Phil Jo, Hwaseong-si (KR); Jun Jin Kong, Yongin-si (KR); Chan Ho Yoon, Seoul (KR); Dong Hyuk Chae, Seoul (KR); Kyoung Lae Cho, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1336 days.

(21) Appl. No.: 12/191,458

(22) Filed: Aug. 14, 2008

(65) Prior Publication Data

US 2009/0070656 A1 Mar. 12, 2009

(30) Foreign Application Priority Data

Aug. 17, 2007 (KR) .................. 10-2007-0082549

(51) Int. Cl.
*G06F 11/00* (2006.01)
(52) U.S. Cl.
USPC .......... 714/795; 714/796; 714/763; 714/784; 714/785
(58) Field of Classification Search
USPC ............... 714/762, 763, 784, 785, 793, 795, 714/796
See application file for complete search history.

(56) References Cited

U.S. PATENT DOCUMENTS

| | | | | |
|---|---|---|---|---|
| 5,323,402 A * | 6/1994 | Vaccaro et al. | | 714/782 |
| 5,996,103 A * | 11/1999 | Jahanghir | | 714/755 |
| 6,122,766 A * | 9/2000 | Fukuoka et al. | | 714/784 |
| 7,051,267 B1 | 5/2006 | Yu et al. | | |
| 7,055,087 B2 * | 5/2006 | Kwon et al. | | 714/784 |
| 7,406,651 B2 * | 7/2008 | Yoon | | 714/784 |
| 7,617,435 B2 * | 11/2009 | Zhang | | 714/756 |
| 7,689,895 B2 * | 3/2010 | Kim et al. | | 714/785 |
| 7,716,562 B1 * | 5/2010 | Wu et al. | | 714/784 |
| 7,814,398 B2 * | 10/2010 | Djurdjevic et al. | | 714/784 |
| 2002/0040462 A1 * | 4/2002 | Sawaguchi et al. | | 714/794 |
| 2004/0172581 A1 * | 9/2004 | Tamura et al. | | 714/718 |
| 2004/0243906 A1 * | 12/2004 | Huang | | 714/758 |
| 2004/0261005 A1 * | 12/2004 | Lee et al. | | 714/795 |

(Continued)

FOREIGN PATENT DOCUMENTS

| | | |
|---|---|---|
| JP | 10-154940 | 6/1998 |
| JP | 2006-244259 | 9/2006 |

OTHER PUBLICATIONS

Feb. 7, 2013 Japanese Office Action in Related Japanese Application No. 2008-209891.

*Primary Examiner* — Bryce Bonzo
*Assistant Examiner* — Elmira Mehrmanesh
(74) *Attorney, Agent, or Firm* — Volentine & Whitt, PLLC (57) ABSTRACT

A memory system includes: a memory controller including an error correction decoder. The error correction decoder includes: a demultiplexer adapted to receive data and demultiplex the data into a first set of data and a second set of data; first and second buffer memories for storing the first and second sets of data, respectively; an error detector; an error corrector; and a multiplexer adapted to multiplex the first set of data and the second set of data and to provide the multiplexed data to the error corrector. While the error corrector corrects errors in the first set of data, the error detector detects errors in the second set of data stored in the second buffer memory.

20 Claims, 9 Drawing Sheets

U.S. PATENT DOCUMENTS

2005/0172208 A1* 8/2005 Yoon .............................. 714/784
2006/0059409 A1* 3/2006 Lee ............................... 714/784
2007/0011590 A1* 1/2007 Chen .............................. 714/784
2007/0067704 A1* 3/2007 Altintas et al. ................ 714/795

* cited by examiner

MEMORY SYSTEM WITH ERROR CORRECTION DECODER ARCHITECTURE HAVING REDUCED LATENCY AND INCREASED THROUGHPUT

CROSS-REFERENCES TO RELATED APPLICATIONS

This claims priority under 35 U.S.C. §119 from Korean Patent Application 10-2007-0082549, filed on 17 Aug. 2007 in the names of Namphil Jo et al., the entirety of which is hereby incorporated by reference for all purposes as if fully set forth herein.

BACKGROUND AND SUMMARY

1. Field

This invention pertains to the field of memory systems, and more particularly, to the field of memory systems employing error correction decoding.

2. Description

In some flash memory systems, a multi-channel error correction coder (ECC) architecture is employed with buffer memories for encoding/decoding the data from the host system to and from the flash memory.

Figure 1:
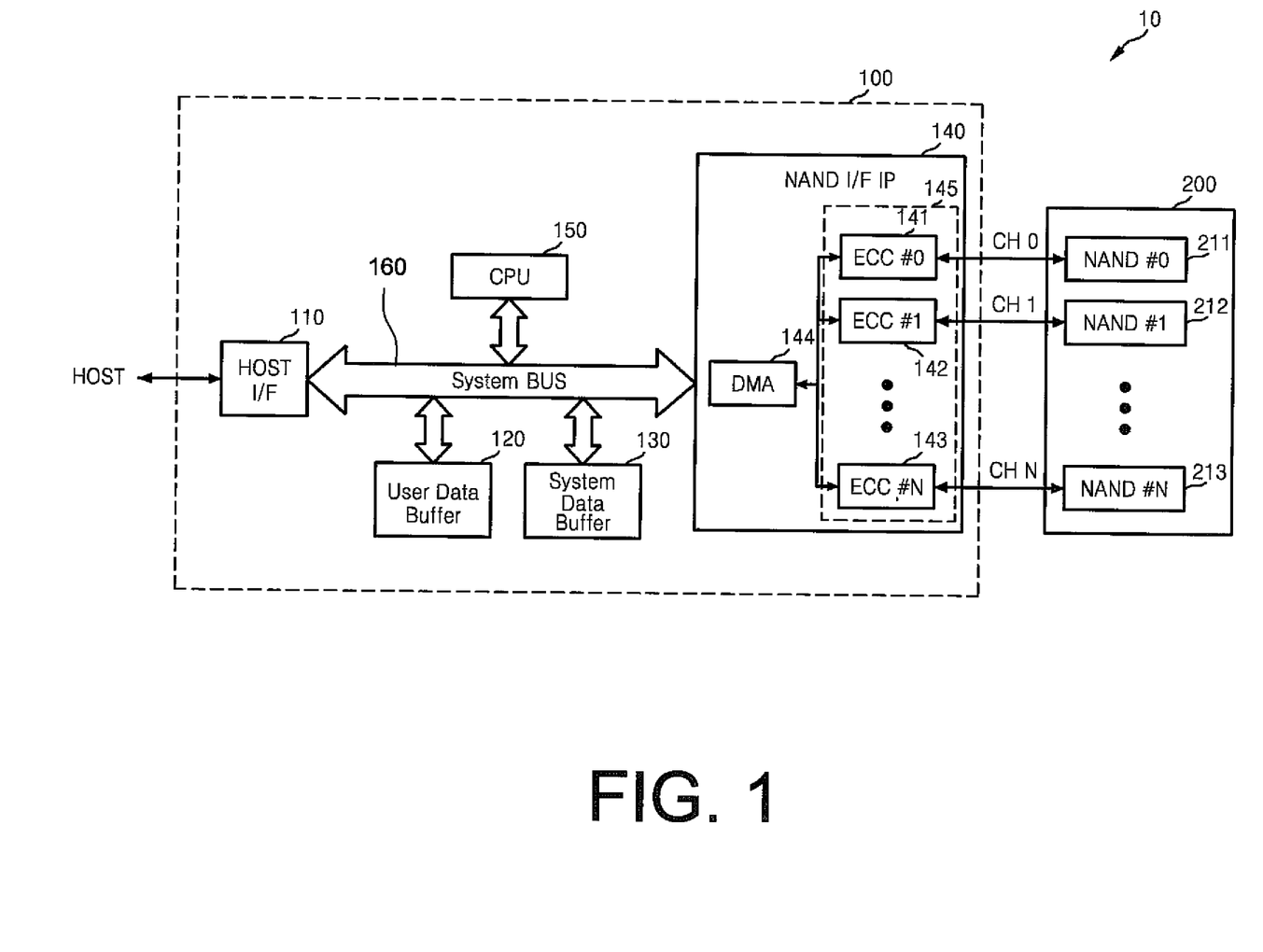
FIG. 1 shows a block diagram of a flash memory system.

FIG. 1 shows a block diagram of such a flash memory system 10. Flash memory system 10 includes a flash memory controller 100 and a memory block 200. Memory controller 100 includes a host interface 110, a user data buffer 120, a system data buffer 130, a NAND interface 140, and a central processing unit 150, all connected together by a system bus 160. NAND interface 140 includes a direct memory access (DMA) controller 144 and an error correction coder (ECC) block 145. ECC block 145 includes a plurality (N) of ECC modules, including ECC modules 141, 142 and 143. Memory block 200 includes a plurality (N) of NAND memory devices, including memory devices 211, 212 and 213. Connected between each of the ECC modules 141, 142 and 143 and a corresponding one of the memory devices 211, 212 and 213 is a channel 0, 1, N, etc.

Figure 2:
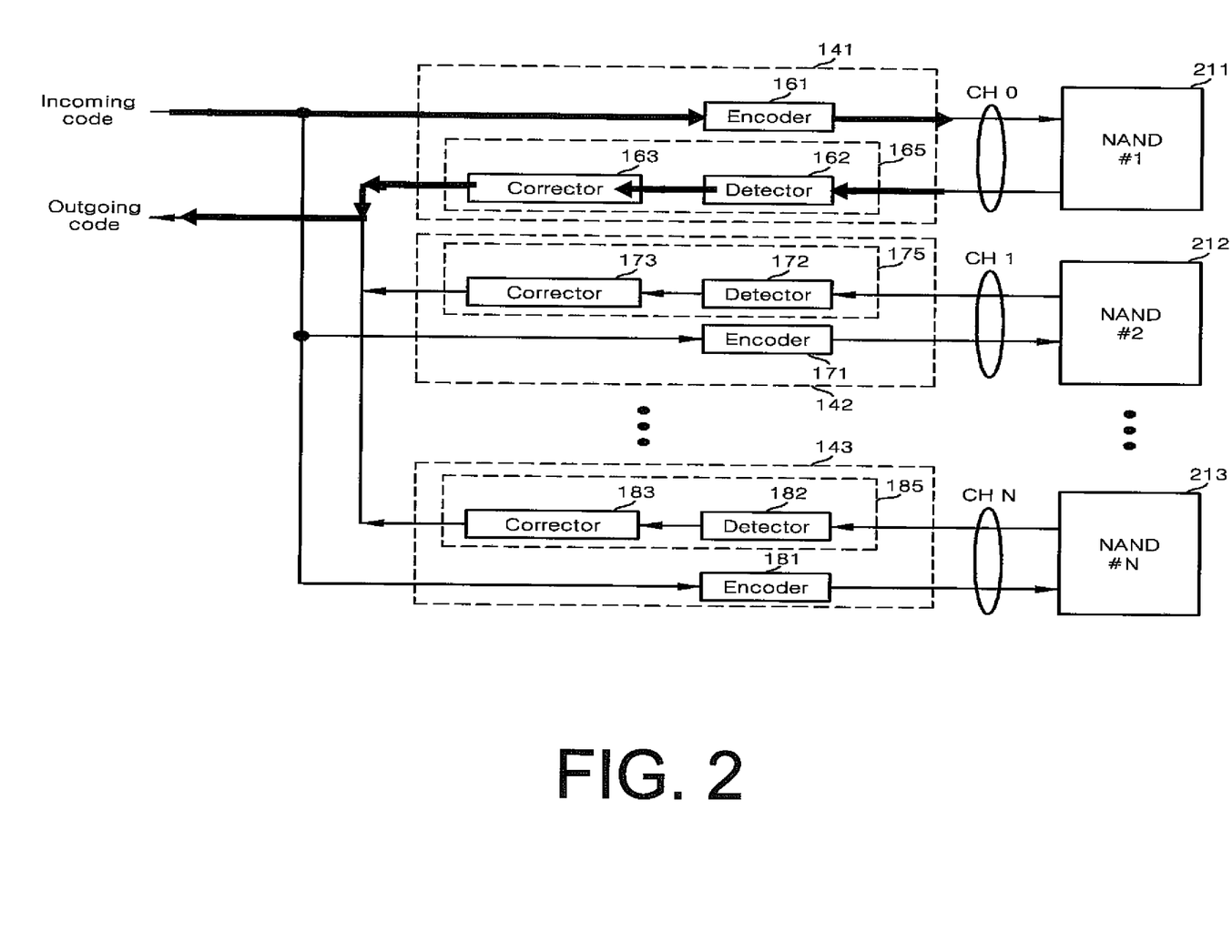
FIG. 2 illustrates connections between an error correction coder (ECC) block and memory devices.

FIG. 2 illustrates in greater detail interconnections between ECC block 145 and memory devices 211, 212 and 213 in flash memory system 10. As seen in FIG. 2, ECC module 141 includes encoder 161, and decoder block 165, which further comprises detector 162 and corrector 163. Likewise, ECC module 142: includes encoder 171, and decoder block 175, which further comprises detector 172 and corrector 173; and ECC module 143 includes encoder 181, and decoder block 185, which further comprises detector 182 and corrector 183.

In operation, data from a host device (e.g., a processor) destined to be stored in a memory device 211, for example, is sent by DMA controller 144 to ECC module 141. In ECC module 141, the data is first encoded by the encoder 161 and then transmitted to memory device 211 via channel 0. When data is to be read from memory device 211 and provided to a host device, it is first decoded by decoder 165 and then the decoded data is supplied to DMA controller 144. In decoder 165, detector 162 detects whether any errors are present in the data received from memory device 211, and if there are any errors, then corrector 163 corrects the errors.

Figure 3:
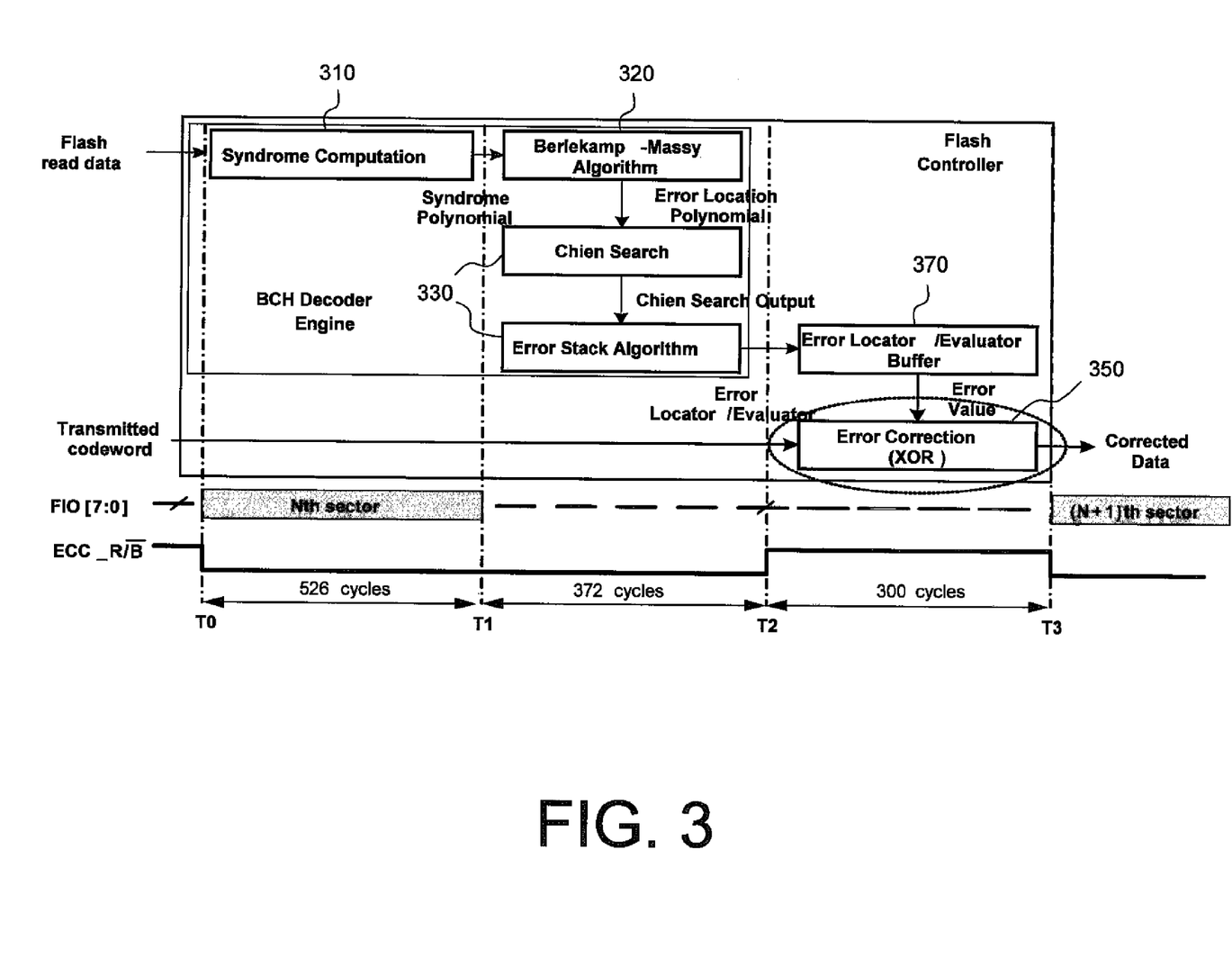
FIG. 3 illustrates conventional decoding operations of a flash memory error correction decoder.

FIG. 3 illustrates conventional decoding operations of one exemplary embodiment of a decoder block, such as decoder block 165 in ECC 141 in FIG. 2, such as decoder block 165 in ECC 141 in FIG. 2 for error correction decoding of data received from a memory device. In the example of FIG. 3, the error correction decoder is a Bose-Chaudhuri-Hocquenghem (BCH) decoder. In particular, FIG. 3 illustrates the timing of decoding operation for each sector of data read from a memory device (e.g., memory device 211). In a first period T0-T1, upon receiving data for an Nth sector from memory device 211, in a step 310 a syndrome computer in the decoder computes the syndrome to determine whether any errors are present in the received data. If the syndrome values are zero, then it is determined that the received data has no errors.

Otherwise, in a second period T1-T2, in a step 320 a key equation solver (KES) block solves the key equation and in a step 330 a Chien search and error evaluator (CSEE) block determines the error values and error locations. Finally, in a third period T2-T3, in a step 350 an error corrector (e.g., corrector 163) in ECC 141 corrects the errors using error values from an error locator/evaluator buffer 370 as the data is read out of decoder block 165. Then ECC 141 is ready to repeat the above-described process for the next (N+1)th sector of data. In the example illustrated in FIG. 3, the first period T0-T1 has 526 clock cycles, the second period T1-T2 has 372 clock cycles, and the third period T2-T3 has 300 clock cycles.

In a memory system having memory devices with low bit-density cells, the error rate in the device will be relatively low, and so the error detection and correction is not critical in view of the total system performance. However, in a memory system with memory devices using a high bit-density single-bit/cell structure, or having a multi-bit/cell structure, then the errors that occur in reading data from the memory devices are greater, requiring more detection and correction steps, and this reduces the read performance in the memory system.

Accordingly, it would be desirable to provide a memory system that can provide robust error detection and correction with an improved throughput. It would also be desirable to provide a memory system that can sustain a high read performance when using memory devices using a high bit-density single-bit/cell structure, or having a multi-bit/cell structure.

The present invention is directed to a memory system, and a method of processing data in a memory system.

In one aspect of the inventive concept, a memory system comprises a memory controller including an error correction decoder. The error correction decoder comprises: a demultiplexer adapted to receive data and demultiplex the data into a first set of data and a second set of data; first and second buffer memories for storing the first and second sets of data, respectively, an error detector; an error corrector; and a multiplexer adapted to multiplex the first set of data and the second set of data and to provide the multiplexed data to the error corrector. While the error corrector corrects errors in the first set of data, the error detector detects errors in the second set of data stored in the second buffer memory.

In another aspect of the inventive concept, a method is provided in a memory system for processing data received by a memory controller from a memory device. The method comprises: receiving data from a memory device; demultiplexing the received data into a first set of data and a second set of data; storing the first set of data into a first buffer memory; determining whether the first set of data includes any errors, while storing the second set of data into a second buffer memory; multiplexing the first set of data from the first buffer memory and the second set of data from the second memory buffer; providing the multiplexed data to an error corrector; and correcting one or more errors in the first set of data with the error corrector while determining whether the second set of data includes any errors.

DETAILED DESCRIPTION

Figure 4:
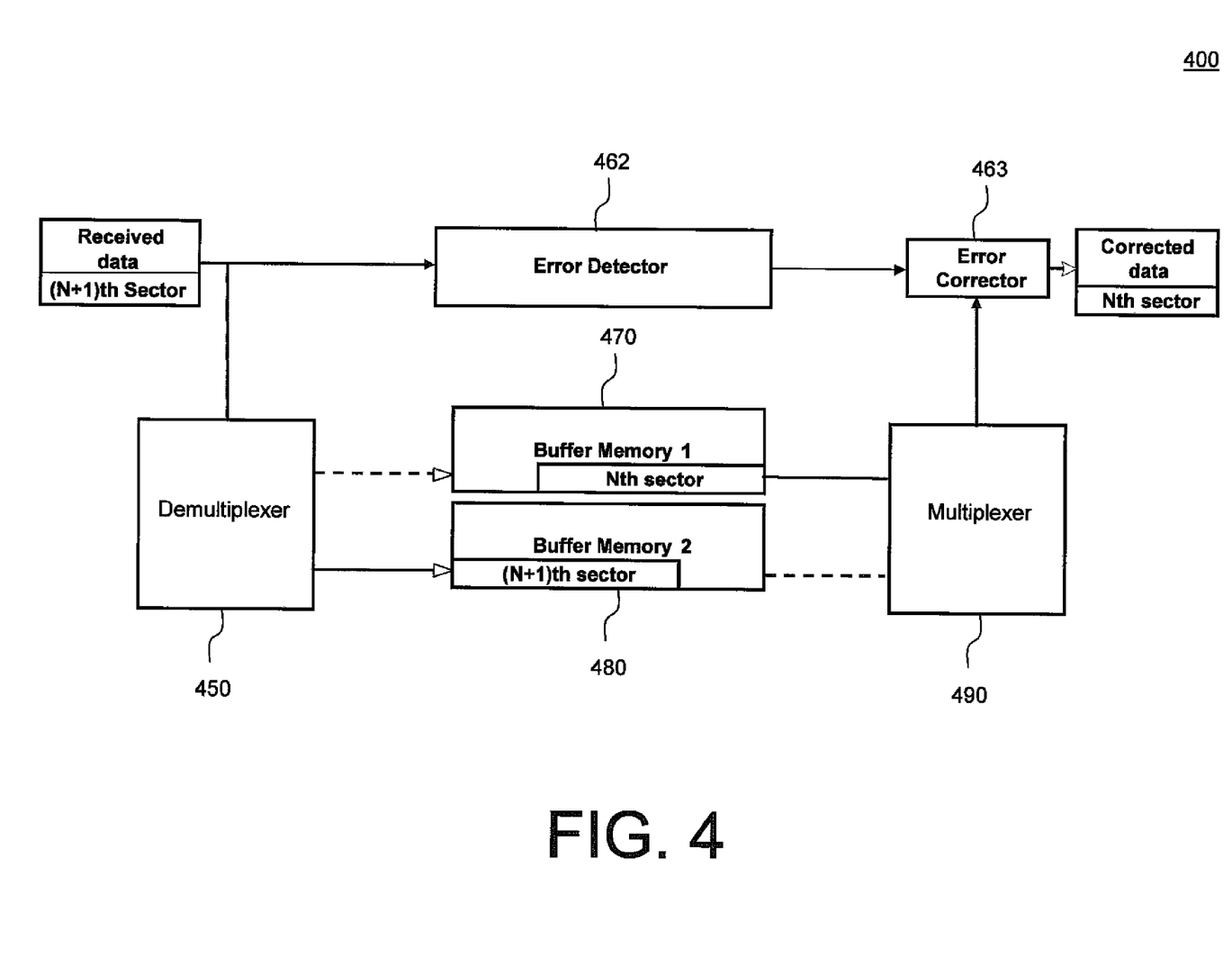
FIG. 4 illustrates a block diagram of one embodiment of a flash memory error correction decoder that can operate in a pipelined mode.

FIG. 4 illustrates a block diagram of one embodiment of a flash memory error correction decoder 400 for a flash memory system that can operate in a pipelined mode. Decoder 400 includes a demultiplexer 450, an error detector 462, an error corrector 463, a first buffer memory 470, a second buffer memory 480 and a multiplexer 490. Demultiplexer 450 is adapted to receive data from a memory device and demultiplex the data into a first set of data and a second set of data, and to send the first set of data to first buffer memory 470, and to send the second set of data to second buffer memory 480. Similarly, multiplexer 490 is adapted to multiplex the first set of data and the second set of data from the first and second memory buffers 470 and 480 and to provide the multiplexed data to error corrector 463. Together, demultiplexer 450, dual buffers 470 and 480, and multiplexer 490 allows error corrector 463 to perform an error correction operation on a first set of data at a same time while error detector 462 performs an error detection operation on a subsequent, second, set of data.

In one embodiment, error correction decoder 400 is a convolutional decoder (e.g., a Viterbi decoder). In that case, error detector 462 calculates branch metrics for the second set of data while the error corrector 463 corrects errors in the first set of data.

Figure 5:
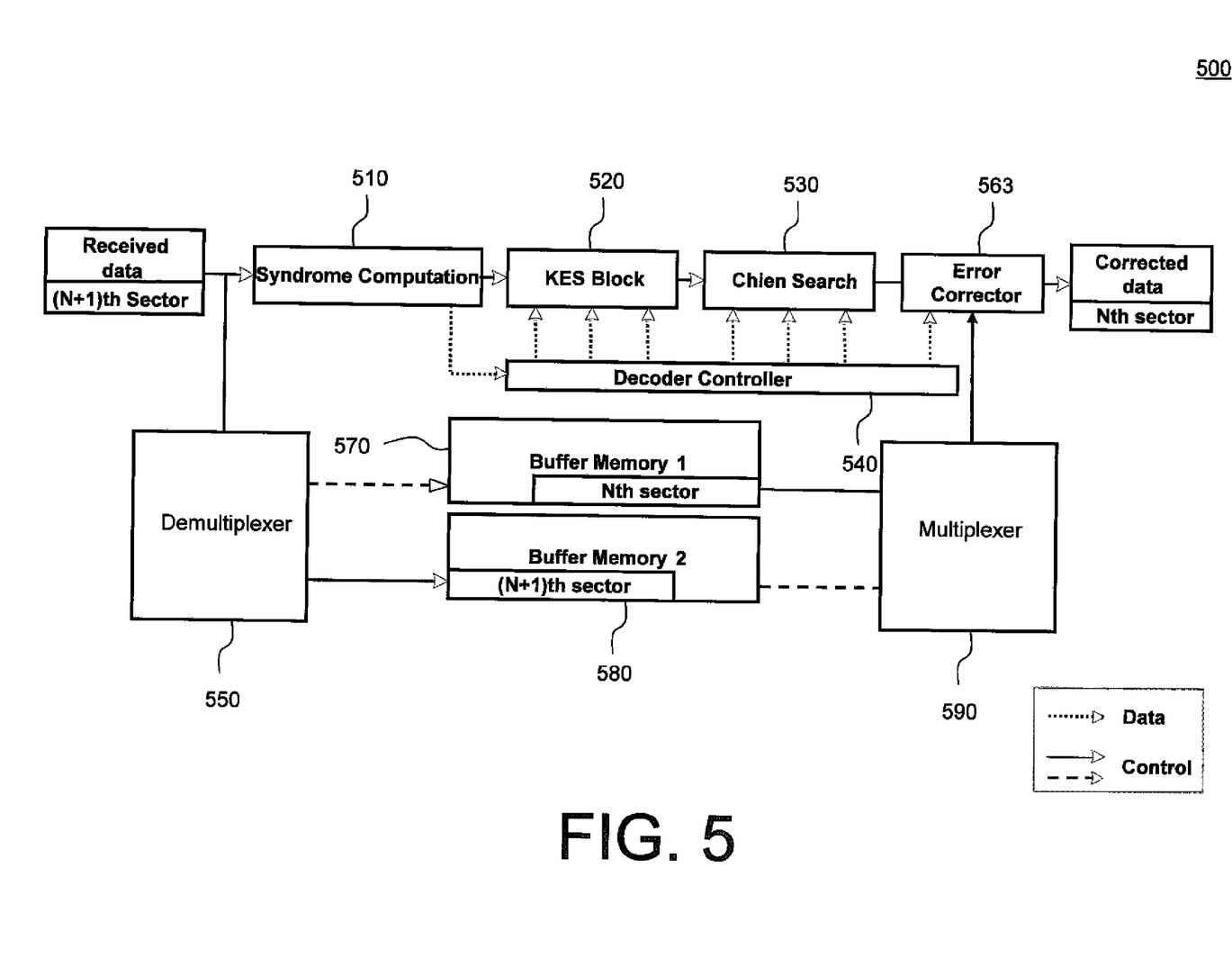
FIG. 5 illustrates a block diagram of one embodiment of a flash memory error correction decoder that can operate in a pipelined mode.

In another embodiment, error correction decoder 500 is a Bose-Chaudhuri-Hocquenghem (BCH) decoder. FIG. 5 illustrates a block diagram of one embodiment of a BCH flash memory error correction decoder 500 that can operate in a pipelined mode. Decoder 500 includes a syndrome computation block 510, a key equation solver (KES) block 520, a Chien search and error evaluator block 530, a decoder controller 540, a demultiplexer (or data switch) 550, an error corrector 563, a first buffer memory 570, a second buffer memory 580, and a multiplexer (or data switch) 590.

In operation, a first set of data (e.g., data from Nth sector) is received via demultiplexer 550 into first buffer memory 570 and syndrome computation block 510 computes a syndrome of a first set of data. If the syndrome indicates that errors have occurred in the first data set, decoder controller 540 controls (KES) block 520 and Chien search and error evaluator block 530 to locate the errors in the first set of data while attempting to minimize latency delays to error corrector 563. Multiplexer 590 sends the first set of data from first memory buffer 570 to error corrector 563 for error correction. In parallel with these operations for the first set of data, a second set of data (e.g., data from an (N+1)th sector) is received via demultiplexer 550 into second buffer memory 580 and syndrome computation block 510 computes a syndrome of the second set of data. After the first set of data is output from decoder 500, then the decoder controller 540 controls (KES) block 520 and Chien search and error evaluator block 530 to locate the errors in the second set of data, wherein multiplexer 590 sends the second set of data from second memory buffer 580 to error corrector 563 for error correction. During this time period, a third set of data is received via demultiplexer 550 into first buffer memory 570 and syndrome computation block 510 computes a syndrome of a third set of data. The process continues in like manner for all subsequent sets of data (e.g., sectors from a memory device).

Figure 6:
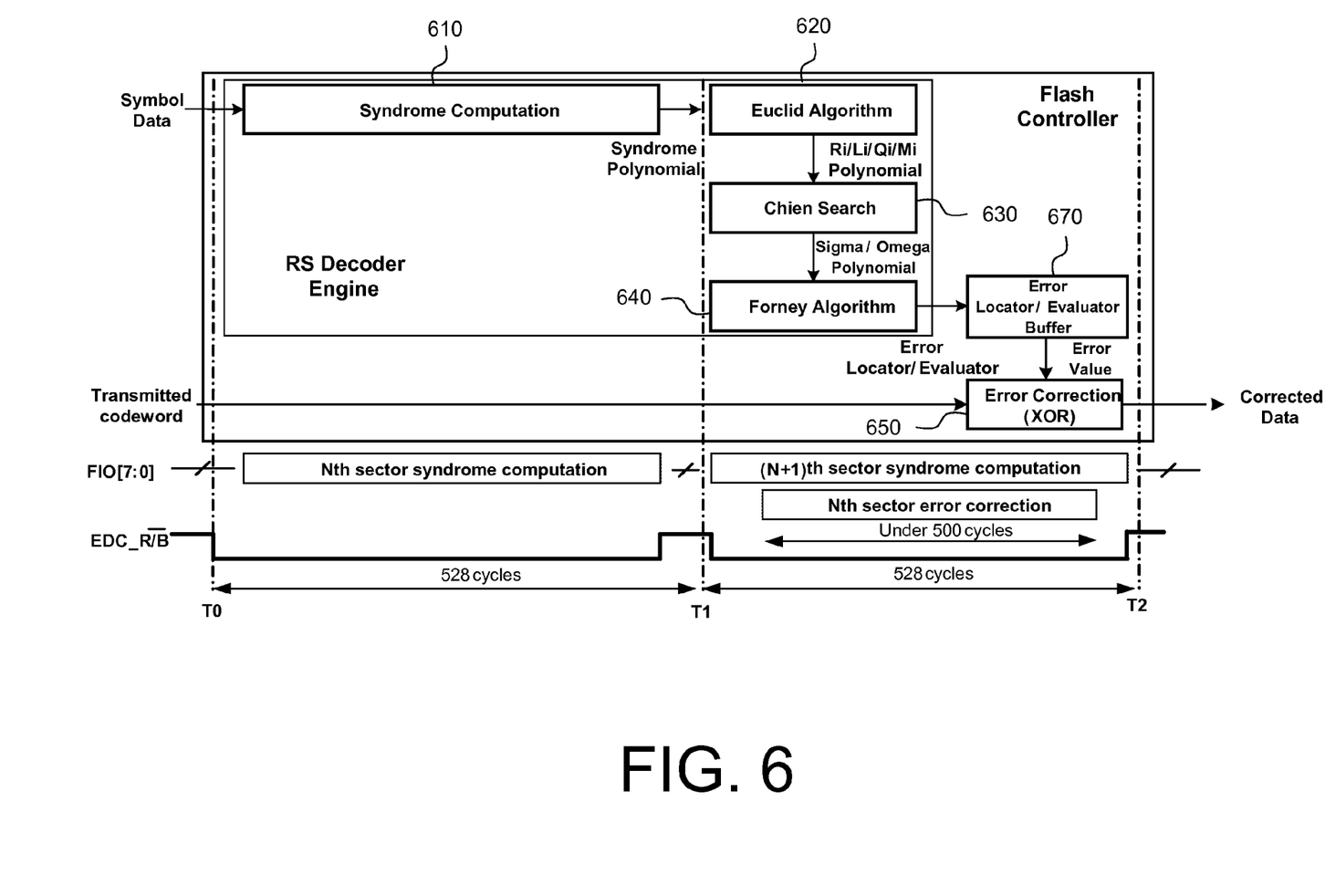
FIG. 6 illustrates decoding operations of a flash memory error correction decoder operating in a pipelined mode.

FIG. 6 illustrates decoding operations of a flash memory decoder where the decoder operates in a pipelined mode. FIG. 6 illustrates a special case of a BCH decoder—in particular, a Reed-Solomon (RS) decoder.

In FIG. 6, in a first period T0-T1, upon receiving a first set of data (e.g., data from an Nth sector) from a memory device (e.g., memory device 211), in a step 610 a syndrome computation block (e.g., syndrome computation block 510) computes the syndrome of the first set of data to determine whether any errors are present in the data. If the syndrome values are zero, then it is determined that the received data has no errors.

Otherwise, in a second period T1-T2, in steps 620, 630, 640 a Euclid algorithm, a Chien search, and a Forney algorithm are executed to determine the error values and error locations in the first set of data. In a step 650, an error corrector (e.g., error corrector 563) corrects the errors using error values from an error locator/evaluator buffer 670, and the corrected first set of data is read out of the error correction decoder.

In the same time period T1-T2, upon receiving a second set of data (e.g., data from an (N+1)th sector) from the memory device, the syndrome computation block computes the syndrome of the second set of data to determine whether any errors are present in the data. That is, during the time period T1-T2, while errors are being located and corrected in the first set of data (e.g., Nth sector data) in a first buffer memory, a syndrome is being calculated to detect whether any errors are present in a second set of data (e.g., (N+1)th sector data) in a second buffer memory.

Following time period T1-T2, the decoder is ready to repeat the above-described steps 620, 630, 640 to determine the error values and error locations in the second set of data for the (N+1)th sector of data from the memory device, while calculating the syndrome for a third set of data from an (N+2)th sector of the memory device. In the example illustrated in FIG. 6, the first period T0-T1 has 528 clock cycles, the second period T1-T2 has 528 clock cycles, and it requires less than 500 clock cycles. Compared to the example shown in FIG. 3. in the example illustrated in FIG. 6 errors are detected and corrected in data sets received from a memory device with a greater throughput.

Figure 7:
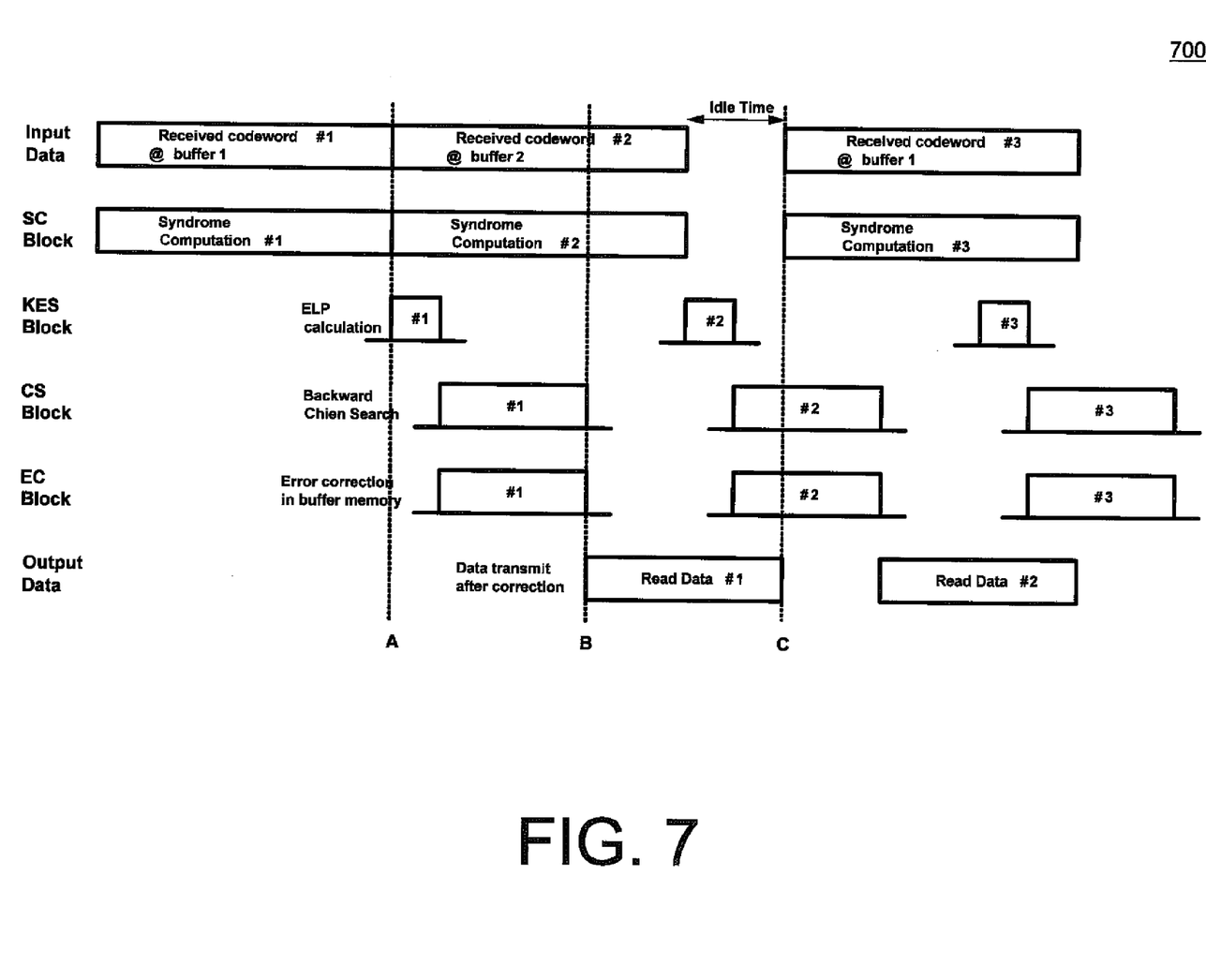
FIG. 7 illustrates a timing chart of pipelined decoding operations of a BCH flash memory error correction decoder employing backward Chien searching.

FIG. 7 illustrates a timing chart 700 of pipelined decoding operations for a BCH flash memory error correction decoder employing backward Chien searching which includes with dual memory buffers for the received data.

The top line of the timing chart 700 represents the timing of receiving input data. As illustrated, in a first time period ending at time "A" a first codeword is received and stored in a first buffer memory. Then, in a second time period a second codeword is received and stored in a second buffer memory. Afterwards, an idle time period is maintained for reading out the corrected data of the first codeword, before in a third time period beginning at time "C," a third codeword is received from a memory device and stored in a first buffer memory.

The second line from the top of the timing chart 700 represents the timing of the computation of syndromes of received codewords. In a first time period a syndrome for the first codeword is computed. Then, in a second time period a syndrome for the second codeword is computed. Afterwards, the idle time period is maintained before in a third time period a syndrome for a third codeword is computed.

The third line from the top of the timing chart 700 represents the timing of solving the key equation for each received codeword. From FIG. 7 it is seen that the decoder solves the key equation for the first codeword in a same time period where it receives and computes the syndrome of the second codeword. After computing the syndrome for the second codeword, the flash memory error correction decoder solves the key equation for the second codeword. The process repeats for each received codeword.

The fourth line from the top of the timing chart 700 represents the timing of performing a backward Chien search for the location of errors in the received codeword. From FIG. 7 it is seen that the decoder performs the backward Chien search for the first codeword in a same time period where it receives and computes the syndrome of the second codeword. After computing the syndrome for the second codeword, the flash memory error correction decoder performs the backward Chien search for the second codeword. The process repeats for each received codeword.

The fifth line from the top of the timing chart 700 represents the timing of the error correction of each received codeword. From FIG. 7 it is seen that the decoder corrects the errors for the first codeword in a same time period where it receives and computes the syndrome of the second codeword. After computing the syndrome for the second codeword, the flash memory error correction decoder corrects the errors for the second codeword. The process repeats for each received codeword.

The bottom line of the timing chart 700 represents the timing of transmitting or outputting corrected data from the decoder. As shown in FIG. 7, because the backward Chien searching algorithm is employed, the flash memory error correction decoder cannot start to read the corrected data out of the decoder until the time "B" when the backward Chien search is completed. The corrected data is completely read out of the flash memory error correction decoder by time "C." Accordingly, in the example shown in FIG. 7, there is an idle time shown on the top line before reading new a third codeword into the flash memory error correction decoder, to reflect the latency between time "A" when the first codeword has been completely read into the flash memory error correction decoder, and the time "C" when the corrected data is completely read out from the flash memory error correction decoder.

Figure 8:
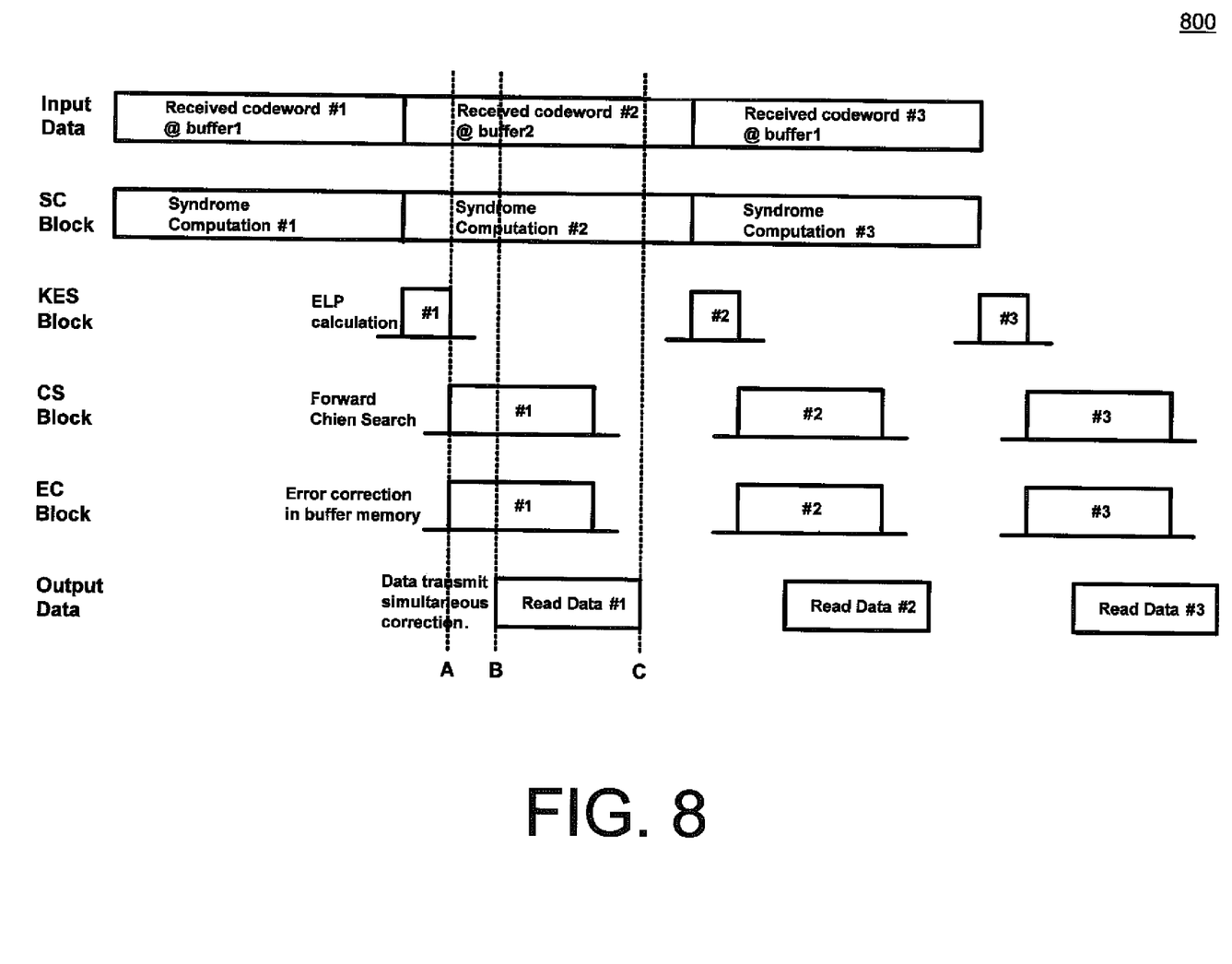
FIG. 8 illustrates a timing chart of pipelined decoding operations of a BCH flash memory error correction decoder employing forward Chien searching.

FIG. 8 illustrates a timing chart 800 of pipelined decoding operations for a BCH flash memory error correction decoder employing forward Chien searching which includes with dual memory buffers for the received data.

The timing of operations in timing chart 800 are similar to those of timing chart 700, and so to avoid redundancy, only the differences will be discussed here.

A principle difference between the example of FIG. 8 and the example of FIG. 7 is that with the forward Chien searching algorithm in timing chart 800, corrected data can be read out of the flash memory error correction decoder before all of the errors in the codeword have been corrected. So there is an overlap in time between the error correction of the first codeword shown on the fifth line from the top of timing chart 800 (and the Chien searching algorithm on the first codeword shown on the fourth line from the top of timing chart 800), and the transmitting or outputting of corrected data from the decoder shown on the bottom line of timing chart 800. In FIG. 8, time "A" represents the time when a first codeword is received and stored in a first buffer memory, time "B" represents the time when the forward Chien error searching algorithm is begun on the first codeword, and time "C" represents the time when the decoder begins to read the corrected data for the first codeword out of the decoder. The latency from time "A" to time "B" depends on factors such as the data width, the clock rate of the decoder, etc.

In contrast to the timing chart 700 of FIG. 7 for the backwards Chien search, in the timing chart 800 of FIG. 8 for the forward Chien search, it is seen that the data transmission is completed at time "C" and no idle time is required on the top line for receiving new codewords and computing their syndromes.

Figure 9:
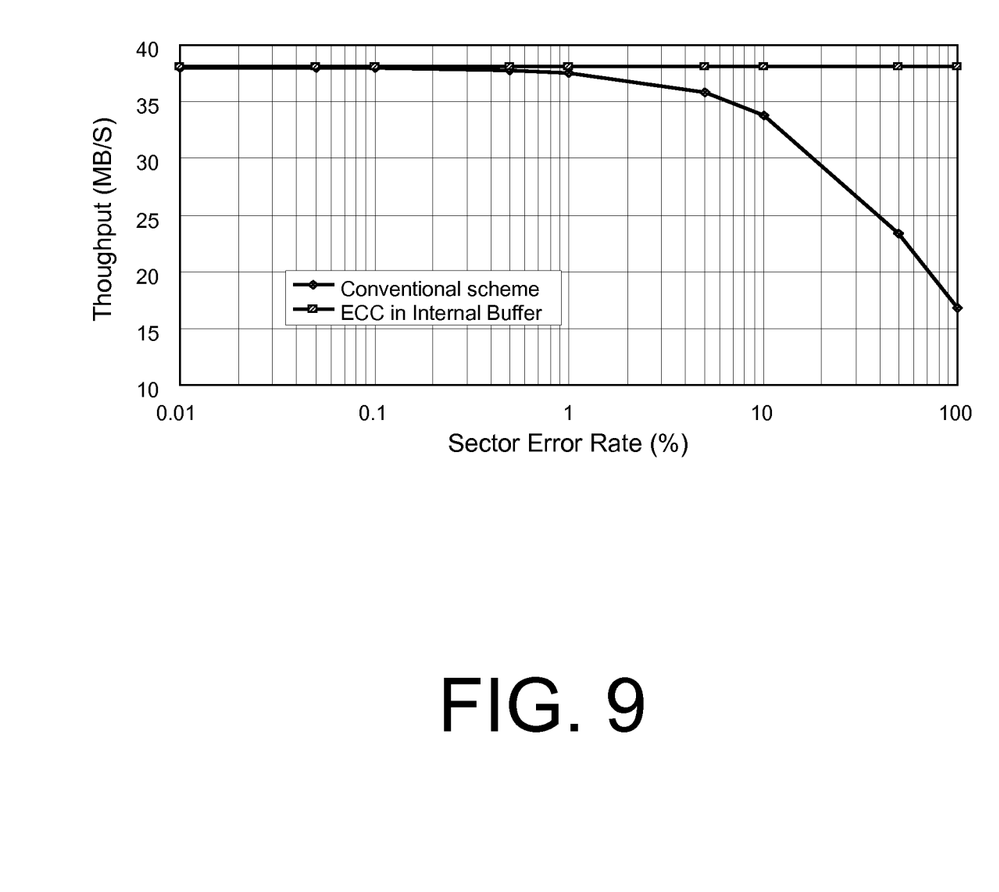
FIG. 9 compares throughput versus sector error rate performance for the memory system of FIG. 1 against the performance of a memory system where the decoder operates in pipelined mode that corrects errors in a first set of data, while detecting errors in a second set of data.

FIG. 9 compares throughput versus sector error rate performance for the memory system of FIG. 1 against the performance of a memory system where the decoder operates in pipelined mode that corrects errors in a first set of data, while detecting errors in a second set of data. It can be seen from FIG. 9 that the memory system where the decoder operates in pipelined mode exhibits increased throughput performance in cases where there is a high memory sector error rate.

While preferred embodiments are disclosed herein, many variations are possible which remain within the concept and scope of the invention. Such variations would become clear to one of ordinary skill in the art after inspection of the specification, drawings and claims herein. The invention therefore is not to be restricted except within the spirit and scope of the appended claims.

What is claimed is:

1. A memory system, comprising:
   a memory controller including an error correction decoder, the error correction decoder comprising:
      a demultiplexer adapted to receive data and demultiplex the data into a first set of data and a second set of data;
      first and second buffer memories for storing the first and second sets of data, respectively,
      an error detector;
      an error corrector; and
      a multiplexer adapted to multiplex the first set of data and the second set of data and to provide the multiplexed data to the error corrector,
   wherein while the error corrector corrects errors in the first set of data, the error detector detects errors in the second set of data stored in the second buffer memory.

2. The memory system of claim 1, wherein error correction decoder is a Viterbi decoder.

3. The memory system of claim 2, wherein the error detector calculates branch metrics for the second set of data while the error corrector corrects errors in the first set of data.

4. The memory system of claim 1, wherein the error correction decoder is a BCH decoder, and further comprising an error location identifier for determining error locations within the first and second data sets.

5. The memory system of claim 4, wherein the error location identifier comprises:
   a key equation solver;
   a Chien-search algorithm block; and
   an error evaluator.

6. The memory system of claim 5, wherein the Chien-search algorithm performs a backward Chien search through each data set.

7. The memory system of claim 5, wherein the Chien-search algorithm performs a forward Chien search through each data set.

8. The memory system of claim 1, wherein the error correction decoder is a Reed-Solomon decoder, and further comprising an error location identifier for determining error locations within the first and second data sets.

9. The system of claim 1, further comprising a memory device external from the controller configured to provide the data to the demultiplexer of the controller.

10. The system of claim 1, wherein the error detector includes a syndrome calculator which calculates a syndrome of the second set of data during a same time period as the error corrector correcting the errors in the first set of data.

11. The system of claim 1, wherein the error detector includes a syndrome calculator, and wherein the error corrector executes a Euclid algorithm, a Chien search, and a Formey algorithm on the first set of data during in parallel with the syndrome calculator calculates a syndrome of the second set of data.

12. The system of claim 11, wherein the error corrector includes an error evaluator buffer which stores error values and locations of errors in the first set of data during a time period wherein the syndrome calculator calculates the syndrome of the second set of data.

13. In a memory system, a method of processing data received by a memory controller from a memory device, the method comprising:
   receiving data from a memory device;
   demultiplexing the received data into a first set of data and a second set of data;
   storing the first set of data into a first buffer memory;
   determining whether the first set of data includes any errors, while storing the second set of data into a second buffer memory;
   multiplexing the first set of data from the first buffer memory and the second set of data from the second memory buffer;
   providing the multiplexed data to an error corrector; and
   correcting one or more errors in the first set of data with the error corrector while determining whether the second set of data includes any errors.

14. The method of claim 13, wherein determining whether the first set of data includes any errors comprises calculating a syndrome value for the first set of data.

15. The method of claim 13, further comprising determining error locations within the first set of data at the same time while determining whether the second set of data includes any errors.

16. The method of claim 15, wherein determining error locations within the first set of data comprises:
   solving a key equation for the first data set;
   executing a Chien-search algorithm for the first data set; and
   evaluating errors in the first data set.

17. The method of claim 16, wherein the Chien-search algorithm performs a backward Chien search through the first data set.

18. The method of claim 16, wherein the Chien-search algorithm performs a forward Chien search through the first data set.

19. The method of claim 13, wherein correcting the one or more errors in the first set of data comprises performing a Viterbi decoding algorithm on the first set of data.

20. The method of claim 19, wherein determining whether the first set of data includes any errors comprises calculating branch metrics for the first set of data.

* * * * *